United States Patent
Ishizaki

(10) Patent No.: US 9,647,181 B2
(45) Date of Patent: May 9, 2017

(54) LIGHT EMITTING DEVICE WITH PHOSPHORS

(71) Applicant: SHARP KABUSHIKI KAISHA, Osaka-shi, Osaka (JP)

(72) Inventor: Shinya Ishizaki, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 15/045,614

(22) Filed: Feb. 17, 2016

(65) Prior Publication Data
US 2016/0197248 A1 Jul. 7, 2016

Related U.S. Application Data

(63) Continuation of application No. 13/991,987, filed as application No. PCT/JP2011/075684 on Nov. 8, 2011, now Pat. No. 9,351,371.

(30) Foreign Application Priority Data

Dec. 9, 2010 (JP) .................................. 2010-274409

(51) Int. Cl.
*H01L 33/50* (2010.01)
*H05B 33/12* (2006.01)
(Continued)

(52) U.S. Cl.
CPC ........ *H01L 33/504* (2013.01); *C09K 11/7721* (2013.01); *C09K 11/7734* (2013.01);
(Continued)

(58) Field of Classification Search
CPC ......... G09G 3/3258; G09G 2300/0465; G09G 2300/0842; G09G 2320/0233;
(Continued)

(56) References Cited

U.S. PATENT DOCUMENTS

2006/0045832 A1 3/2006 Nagatomi et al.
2006/0071589 A1* 4/2006 Radkov .............. C09K 11/0883
313/487
(Continued)

FOREIGN PATENT DOCUMENTS

EP 2 048 718 A1 4/2009
EP 2 246 409 A1 11/2010
(Continued)

OTHER PUBLICATIONS

International Search Report for PCT/JP2011/075684, mailed Dec. 6, 2011.

*Primary Examiner* — Nimeshkumar Patel
*Assistant Examiner* — Jacob R Stern
(74) *Attorney, Agent, or Firm* — Nixon & Vanderhye P.C.

(57) ABSTRACT

Provided is a light emitting device in which with the general color rendering index Ra and the special color rendering index R9 maintained at high numeric values, the light emission efficiency is prevented from being reduced as much as possible, and the high color rendering and the high efficiency are achieved so as to be usable for general lighting usage. The device includes at least one light emitting element 6 emitting a light having a peak emission wavelength in a near-ultraviolet to blue region, and a phosphor layer 5 containing a green phosphor excited by a primary light emitted from the light emitting element 6 and emitting a light having a peak emission wavelength in a green region, a first red phosphor excited by the primary light and emitting a light having a peak emission wavelength in a red region, and a second red phosphor exited by the primary light and emitting a light having a peak emission wavelength different from that of the first red phosphor in the red region.

11 Claims, 10 Drawing Sheets

(51) Int. Cl.
- *C09K 11/77* (2006.01)
- *H01L 33/48* (2010.01)
- *H01L 33/62* (2010.01)
- *H01L 25/075* (2006.01)

(52) U.S. Cl.
CPC .......... *H01L 33/486* (2013.01); *H01L 33/505* (2013.01); *H01L 33/62* (2013.01); *H05B 33/12* (2013.01); *H01L 25/0753* (2013.01); *H01L 33/507* (2013.01); *H01L 2224/48091* (2013.01); *H01L 2224/48137* (2013.01)

(58) Field of Classification Search
CPC . H01L 27/3248; H01L 51/52; H01L 27/3244; H01L 27/3269
See application file for complete search history.

(56) References Cited

U.S. PATENT DOCUMENTS

| | | |
|---|---|---|
| 2006/0208262 A1 | 9/2006 | Sakuma et al. |
| 2007/0052342 A1 | 3/2007 | Masuda et al. |
| 2007/0241657 A1 | 10/2007 | Radkov et al. |
| 2007/0259206 A1 | 11/2007 | Oshio |
| 2008/0180948 A1 | 7/2008 | Yoon et al. |
| 2008/0296592 A1 | 12/2008 | Osamu |
| 2008/0299398 A1* | 12/2008 | Hata ............ C09K 11/02 428/412 |
| 2008/0303409 A1 | 12/2008 | Hirosaki |
| 2009/0134775 A1 | 5/2009 | Watanabe et al. |
| 2010/0044739 A1* | 2/2010 | Reeh ............ C09K 11/7718 257/98 |
| 2010/0181580 A1 | 7/2010 | Masuda |
| 2010/0224895 A1 | 9/2010 | Murazaki et al. |
| 2011/0043101 A1 | 2/2011 | Masuda et al. |

FOREIGN PATENT DOCUMENTS

| | | |
|---|---|---|
| JP | 2001-332770 A | 11/2001 |
| JP | 2006-016413 A | 1/2006 |
| JP | 2006-077740 A | 3/2006 |
| JP | 2006-147999 A | 6/2006 |
| JP | 2006-261512 A | 9/2006 |
| JP | 2007-070445 A | 3/2007 |
| JP | 2007-113019 A | 5/2007 |
| JP | 2007-116117 A | 5/2007 |
| JP | 2007-180377 A | 7/2007 |
| JP | 2007-231245 A | 9/2007 |
| JP | 2008-508742 A | 3/2008 |
| JP | 2008-081631 A | 4/2008 |
| JP | 2008-166825 | 7/2008 |
| JP | 2008-169395 | 7/2008 |
| JP | 2008-192797 A | 8/2008 |
| JP | 2008-300386 A | 12/2008 |
| JP | 2009-4698 A | 1/2009 |
| JP | 2009-035673 | 2/2009 |
| JP | 2009-49000 A | 3/2009 |
| JP | 2009-164242 A | 7/2009 |
| JP | 2009-206383 A | 9/2009 |
| JP | 2009-239242 A | 10/2009 |
| JP | 2009-277998 | 11/2009 |
| JP | 2010-004035 A | 1/2010 |
| JP | 2010-050235 A | 3/2010 |
| JP | 2010-80796 A | 4/2010 |
| JP | 2010-100743 | 6/2010 |
| JP | 2010-222587 | 10/2010 |
| WO | 2006/023100 A1 | 3/2006 |
| WO | WO 2009/011205 A1 | 1/2009 |
| WO | WO 2009/028657 A1 | 3/2009 |
| WO | 2009/110285 A1 | 9/2009 |

* cited by examiner

| Item | Combination of Phosphors | | | Optical Property | | | |
|---|---|---|---|---|---|---|---|
| | Green Phosphor | First Red Phosphor | Second Red Phosphor | Light Emission Intensity | Ra | R9 | Color Temperature |
| | Peak Emission Wavelength Mixture Ratio | Peak Emission Wavelength Mixture Ratio | Peak Emission Wavelength Mixture Ratio | | | | |
| Example 1 | 535 / 5 | 620 / 0.98 | 650 / 0.02 | 118.6% | 81.65 | 9.31 | 3263 |
| Example 2 | 520 / 5 | 620 / 0.98 | 650 / 0.02 | 109.3% | 83.57 | 12.16 | 3004 |
| Example 3 | 535 / 5 | 620 / 0.83 | 630 / 0.17 | 115.9% | 82.26 | 9.44 | 3041 |
| Example 4 | 535 / 5 | 620 / 0.78 | 650 / 0.22 | 115.0% | 83.58 | 20.24 | 2987 |
| Example 5 | 535 / 5 | 620 / 0.5 | 650 / 0.5 | 110.0% | 86.41 | 36.02 | 3323 |
| Example 6 | 535 / 5 | 620 / 0.25 | 650 / 0.75 | 105.0% | 91.1 | 55.9 | 3268 |
| Example 7 | 535 / 5 | 620 / 0.02 | 650 / 0.98 | 100.0% | 93.7 | 82.75 | 3316 |

Fig. 2

| Item | Combination of Phosphors | | Optical Property | | | |
|---|---|---|---|---|---|---|
| | Phosphor1 | Red Phosphor | Light Emission Intensity | Ra | R9 | Color Temperature |
| | Peak Emission Wavelength | Peak Emission Wavelength | | | | |
| | Mixture Ratio | Mixture Ratio | | | | |
| Comparative Example 1 | 560 | 630 | 124.0% | 73.0 | -5.0 | 2950 |
| | 3.3 | 1 | | | | |
| Comparative Example 2 | 560 | 650 | 114.0% | 77.0 | 20.0 | 3000 |
| | 3.9 | 1 | | | | |

Fig. 3

LIGHT EMITTING DEVICE WITH PHOSPHORS

This application is a continuation of U.S. patent application Ser. No. 13/991,987 filed Jun. 6, 2013, which is a National Phase filing under 35 U.S.C. §371 of International Application No. PCT/JP2011/075684 filed on Nov. 8, 2011, and which claims priority to Japanese Patent Application No. 2010-274409 filed on Dec. 9, 2010.

TECHNICAL FIELD

The present invention relates to a light emitting device available for a lighting apparatus, a light source of a display device, or the like, particularly, to a light emitting device capable of maintaining light emission luminance or minimizing its reduction, and achieving a high color rendering property.

BACKGROUND ART

Various kinds of semiconductor light emitting devices such as a lighting device having a semiconductor light emitting element (hereinafter, appropriately referred to as the "light emitting element") have been developed, and means for improving an output performance have been variously studied. Especially, as for a light emitting device usable for a general lighting apparatus, it is important to have a high color rendering property (basically, a general color rendering index Ra is 80 or more in U.S. Energy Star standard, or the like) as its performance.

Representative methods for implementing a white light emission in the semiconductor light emitting device include firstly a method which uses three kinds of LED (light emitting diode) chips which emit red, green, and blue, secondly a method which combines a blue LED chip and a yellow or orange phosphor, thirdly a method which combines a blue LED chip, a green phosphor, and a red phosphor, and fourthly a method which combines an ultraviolet emission LED chip, a blue phosphor, a green phosphor, and a red phosphor. Among them, the second or third method is widely put into practical use in general.

In a structure of an LED device employing the above method, the LED chip is mounted on a cup part (concave part) of a wiring substrate, and a transparent sealing resin mixed with a phosphor is poured into the cup part and hardened to form a resin layer containing the phosphor (see patent document 1 and patent document 2, for example).

According to a light emitting device disclosed in the patent document 1, it has a structure in which a blue LED chip is used as a light emitting element, and three kinds of phosphors such as two kinds of yellow phosphors having different peak emission wavelengths and a red phosphor are mixed and dispersed in a transparent resin to form a phosphor layer. Especially, the two kinds of the yellow phosphors include a first yellow phosphor having a peak emission wavelength of 540±20 nm, and a second yellow phosphor having a peak emission wavelength longer than the peak emission wavelength of the first yellow phosphor but 590 nm or less, and by adjusting a mixture ratio of the red phosphor, light emission luminance is prevented from being reduced as much as possible, and a relatively high color rendering property and high light emission luminance are achieved at the same time.

According to a light emitting device disclosed in the patent document 2, a peak emission wavelength is elongated by adding Al and B in a nitride phosphor serving as a red phosphor, so that a deeper red light emission is provided, and a phosphor layer is configured in combination with another phosphor (such as green phosphor, or yellow phosphor), so that a white light emission is provided.

PRIOR ART DOCUMENTS

Patent Documents

Patent document 1: Japanese Patent Application Laid-Open No. 2007-116117
Patent document 2: International Publication No. 2006-077740

DISCLOSURE OF THE INVENTION

Problems to be Solved by the Invention

However, the configuration of the phosphor layer disclosed in the patent document 1 has a problem that a blue light emission from the LED is combined with yellow and red light emissions from the phosphor layer, and a light emission in a green region is small, so that especially, color reproducibility in the green region cannot be performed efficiently, and a color rendering index (Ri: i=1 to 15) is biased.

In addition, in order to improve the general color rendering index Ra and especially a special color rendering index R9 (red), a red phosphor having a peak emission wavelength in a relatively long wavelength region (630 nm or more) needs to be contained, but when the peak emission wavelength is shifted to the long wavelength region, as for efficiency of the red phosphor, the efficiency of the phosphor itself is abruptly reduced due to an effect of human relative luminous efficiency, and as a result, efficiency of the semiconductor light emitting device is reduced. Among several indexes for the light emission efficiency, luminous efficiency (unit: lm/W) to an input power is usually used, and the same is true in this specification. The relative luminous efficiency is defined as spectral luminous efficiency in a standard relative luminous efficiency curve of CIE (Commission Internationale de l'eclairage) internationally, and in appended table 8 of measurement unit rule of an Ordinance No. 189 of Ministry of Economy, Trade and Industry in Japan. That is, the effect of the human relative luminous efficiency means that the human senses the light in the vicinity of 555 nm most strongly in a light place and senses the light in the vicinity of 507 nm most strongly in a dark place, so that the sensitivity is lowered for the light whose wavelength becomes long or short apart from the peak wavelengths, which makes the human feel that it gets darker. The luminous efficiency in the case of red is reduced as the wavelength becomes long.

In addition, according to the light emitting device disclosed in the patent document 2, a specific method to make the red phosphor achieve the deep red, and a plurality of examples about the light emitting device in which the red phosphor and the other phosphor are combined are disclosed, but it does not disclose an index showing that at what mixture ratio the phosphors are to be adjusted, in order to achieve the high color rendering property in the same combination of the phosphors.

The present invention was made in view of the above problems, and its object is to provide a light emitting device in which with the general color rendering index Ra and the special color rendering index R9 maintained at high numeric values, light emission efficiency is prevented from being reduced as much as possible, and high color rendering and high efficiency are achieved so as to be usable for general lighting usage.

Means for Solving the Problem

In order to accomplish the above object, concentrated studies by the inventor of the present invention have found that a color rendering property and light emission intensity can be controlled in a light emitting device provided with an LED having a peak emission wavelength in a near-ultraviolet to blue region, and a phosphor layer containing a green phosphor and a red phosphor, by using, as the red phosphor, two kinds such as a red phosphor having a peak emission wavelength in a short wavelength region which is close to a peak of relative luminous efficiency and greatly contributes to maintaining and improving the light emission intensity, and a red phosphor having a peak emission wavelength in a long wavelength region which greatly contributes to improving the color rendering property, and adjusting their mixture ratio.

That is, according to the present invention, in order to accomplish the above object, a light emitting device includes at least one light emitting element emitting a light having a peak emission wavelength in a near-ultraviolet to blue region; and a phosphor layer containing a green phosphor excited by a primary light emitted from the light emitting element and emitting a light having a peak emission wavelength in a green region, a first red phosphor excited by the primary light and emitting a light having a peak emission wavelength in a red region, and a second red phosphor exited by the primary light and emitting a light having a peak emission wavelength different from that of the first red phosphor in the red region.

Furthermore, as for the above light emitting device, it is preferable that the peak emission wavelength of the green phosphor falls within a wavelength range of 510 nm or more and 550 nm or less, the peak emission wavelength of the first red phosphor falls within a wavelength range of 610 nm or more and less than 625 nm, and the peak emission wavelength of the second red phosphor falls within a wavelength range of 625 nm or more and 670 nm or less, and it is preferable that the light emitting element is an LED chip emitting a light having a peak emission wavelength within a wavelength range of 350 nm or more and 490 nm or less.

Furthermore, it is preferable that the light emitting element is an LED chip emitting a light having a peak emission wavelength within a wavelength range of 430 nm or more and 490 nm or less. Alternatively, it is preferable that the light emitting element is an LED chip emitting a light having a peak emission wavelength within a wavelength range of 350 nm or more and less than 430 nm, and the phosphor layer further contains a blue phosphor excited by the primary light emitted from the light emitting element and emitting a light having a peak emission wavelength in a wavelength range of 430 nm or more and 490 nm or less.

Furthermore, as for the above light emitting device, it is preferable that the LED chip is an InGaN series LED chip, it is preferable that the green phosphor contains any one of an $Al_5Lu_xO_y$: Ce series phosphor, a $Ca_3(Sc, Mg)_2Si_3O_{12}$: Ce series phosphor, and an $Al_5O_{12}Y_3$: Ce series phosphor, and it is preferable that each of the first and second red phosphors is a (Sr, Ca)AlSiN$_3$: Eu series phosphor, or a CaAlSiN$_3$: Eu series phosphor.

According to the above light emitting device, emission spectra of all light components of blue, green, and red serving as three primary light colors are provided, and the two kinds of the red phosphors are used, so that the emission spectrum of the red component can be widened, and a high color rendering property can be achieved. When the red emission spectrum is shifted to a long wavelength side, the luminous efficiency is reduced, so that in order to achieve the high color rendering property with the one kind of phosphor, light emission efficiency is considerably reduced, but when the two kinds of red phosphors are used, the high color rendering property can be achieved while the light emission efficiency is maintained.

Furthermore, as for the above light emitting device, it is preferable that each weight allocation to total weight of the first and second red phosphors is adjusted so that the general color rendering index Ra shows that 80≤Ra≤97. Especially, it is preferable that a weight ratio of the second red phosphor to the total weight of the first and second red phosphors is adjusted to be 25% or less so that the general color rendering index Ra shows that 80≤Ra≤85, the weight ratio of the second red phosphor to the total weight of the first and second red phosphors is adjusted to be 25% or more and 75% or less so that the general color rendering index Ra shows that 85≤Ra≤90, or the weight ratio of the second red phosphor to the total weight of the first and second red phosphors is adjusted to be 75% or more so that the general color rendering index Ra shows that 90≤Ra≤97.

According to the above light emitting device, in a case where it is used as a light source for lighting, owing to use of the two kinds of red phosphors, the desired general color rendering index Ra can be selected, in a region having the general color rendering index Ra of 80 or more in which it can be used as high color rendering lighting. According to the CIE, it is defined that when the general color rendering index Ra is in the range of 80≤Ra≤90, the light can be used in a house, hotel, store, school, or the like, and when it is in the range of Ra≥90, the light can be used in a museum. The color rendering property and the light emission efficiency can be adjusted according to a usage environment by adjusting a mixture ratio of the first and second red phosphors. In addition, as the mixture ratio of the second red phosphor is increased, the general color rendering index Ra is improved, but the light emission efficiency is relatively reduced. However, according to the above light emitting device, the mixture ratio of the first and second red phosphors can be adjusted within the range of 80≤Ra≤97, so that when the color rendering property is prioritized, the mixture ratio of the second red phosphor is to be increased, while when the light emission efficiency is prioritized, it is to be decreased, whereby the device can be applied to various usage.

Furthermore, since the two kinds of the red phosphors are used, as for the special color rendering index R9 also, the high color rendering property can be achieved while the light emission efficiency is maintained, compared with the case where the one kind of the red phosphor is used. Furthermore, when the color rendering property is prioritized, the mixture ratio of the second red phosphor is to be increased, while when the light emission efficiency is prioritized, it is to be decreased, whereby the device can be applied to various usage.

Furthermore, according to the above light emitting device, it is preferable that the phosphor layer is formed such that grains of the green phosphor, grains of the first red phosphor, and grains of the second red phosphor are mixed in a transparent resin, or formed to have a laminated structure composed of a green phosphor layer having grains of the green phosphor mixed in a transparent resin, a first red phosphor layer having grains of the first red phosphor mixed in a transparent resin, and a second red phosphor layer having grains of the second red phosphor mixed in a transparent resin, or the phosphor layer is formed to have a laminated structure composed of a green phosphor layer having grains of the green phosphor mixed in a transparent resin, and a red phosphor layer having grains of the first red phosphor and grains of the second red phosphor mixed in a transparent resin.

Furthermore, it is preferable that the light emitting element is sealed with the phosphor layer, a lowermost layer of the phosphor layer, or a transparent resin layer provided to be closer to the light emitting element than the phosphor layer and not containing a phosphor. In addition, it is preferable that the green phosphor layer is positioned above the layer in which the first red phosphor and the second red phosphor exist.

Thus, the structure of the phosphor layer and the sealed structure of the light emitting element can include a variety of structures according to a mounting configuration. Especially, when the green phosphor layer is provided in the upper part of the phosphor layer, the green light emitted from the green phosphor can be prevented from being absorbed by the first or the second red phosphor, so that high light emission efficiency can be achieved.

Furthermore, it is preferable that a median value of a grain diameter of the green phosphor is 8 μm or more and 20 μm or less, and a median value of a grain diameter of each of the first red phosphor and the second red phosphor is 5 μm or more and 15 μm or less. Thus, each phosphor can be used in a region in which the light emission efficiency is high, and as a result, the high light emission efficiency can be achieved. Furthermore, it is preferable that the transparent resin of each layer of the phosphor layer is a silicone resin having a viscosity of 3 Pa·s or more and 20 Pa·s or less before being hardened. Thus, a step of uniformly dispersing and mixing grains of the phosphor in the transparent resin can be performed with high productivity.

Effect of the Invention

As described above, according to the above light emitting device, it is possible to provide the light emitting device in which with the general color rendering index Ra and the special color rendering index R9 maintained at high numeric values, the light emission efficiency is prevented from being reduced as much as possible, and the high color rendering and the high efficiency are achieved so as to be usable for general lighting usage.

BRIEF DESCRIPTION OF THE DRAWINGS

FIG. 2 is a view of a list displaying a peak emission wavelength and a mixture ratio of each phosphor, and optical properties in examples 1 to 7 of the light emitting device according to the present invention.

FIG. 3 is view of a list displaying a peak emission wavelength and a mixture ratio of each phosphor, and optical properties in comparative examples 1 and 2.

MODE FOR CARRYING OUT THE INVENTION

Figure 1A:
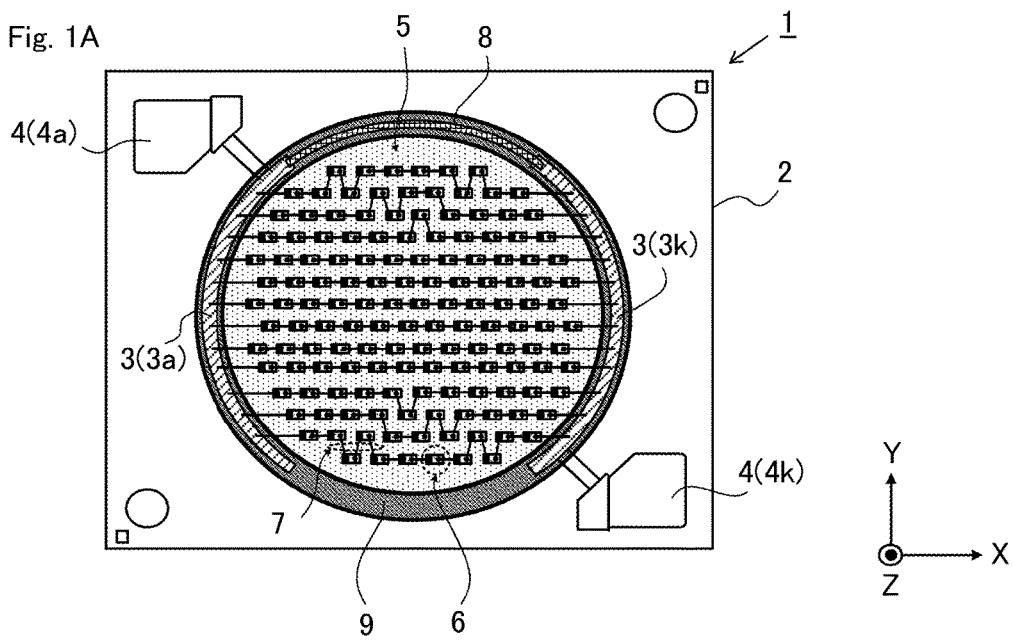
FIG. 1A is a schematic top view schematically showing a schematic structure of one embodiment of a light emitting device according to the present invention.

An embodiment of a light emitting device according to the present invention (hereinafter, referred to as the "present light emitting device") will be described assuming that it is used as a white light source for lighting, with reference to the drawings. In addition, in the drawings showing a structure of the present light emitting device, an essential part is appropriately exaggerated, or some parts are schematically shown, so that a dimensional ratio of each part does not always coincide with that of an actual structure.

Figure 1B:
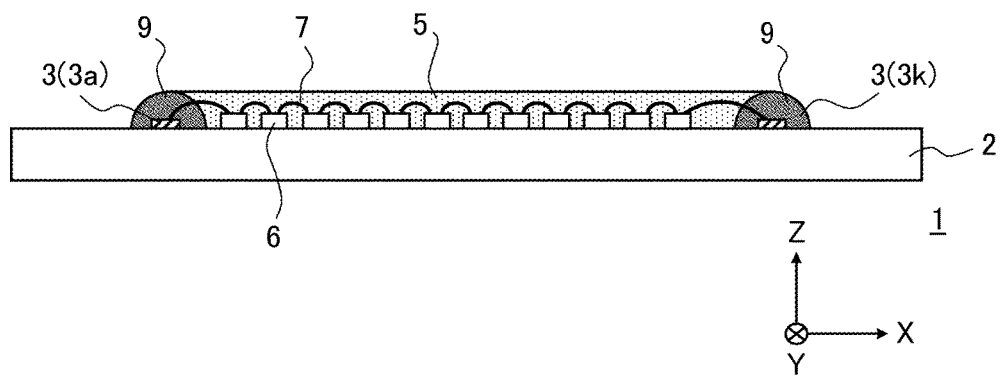
FIG. 1B is a cross sectional schematic view of the embodiment of FIG. 1A.

FIG. 1 schematically shows one example of a structure of the present light emitting device. As shown in FIG. 1, a present light emitting device 1 is provided with a ceramic substrate 2, wiring patterns 3 (3a and 3k), electrode lands 4 (4a and 4k), a phosphor layer 5, LED chips 6, wires 7, a printed resistive element 8, and a resin dam 9. In addition, FIG. 1(a) is a top view, and FIG. 1(b) is a cross-sectional view of essential parts in an X-Z cross-sectional surface which cuts the LED chips 6 and the wires 7. In FIG. 1(a), an inner side is transparently shown to make a connection relationship clear.

The ceramic substrate 2 is in the form of a rectangular shape when viewed from the top, and as one example, its outline is 24 mm×20 mm, and its thickness is 1 mm. The wiring patterns 3a and 3k are formed on the ceramic substrate 2 by screen printing method so as to be opposed to each other. Each of the wiring patterns is in the form of an arc shape partially cut from a circular ring when viewed from the top of the present light emitting device 1. The electrode lands 4a and 4k are formed of a material such as Ag—Pt by the screen printing method, as externally connecting electrodes (for purpose of a power supply, for example). Their thickness is 20 μm, as one example. The electrode land 4a is connected to one end of the wiring pattern 3a through a lead-out wiring, and the electrode land 4k is connected to one end of the wiring pattern 3k through a lead-out wiring.

The phosphor layer 5 partially converts a light (such as blue light) emitted from the LED chips 6, to a green light and two kinds of red lights, mixes the four colors of the lights, and emits a white light. The phosphor layer 5 is formed such that a phosphor mixed resin in which grains of a green phosphor, grains of a first red phosphor, and grains of a second red phosphor are uniformly dispersed and mixed in a transparent resin is injected into an inner side of the resin dam 9 formed into a circular ring, and thermally hardened at 100° C. for one hour and then at 150° C. for 3 to 5 hours. In addition, the phosphor layer 5 functions as a sealing resin for sealing the LED chips 6. A thickness of the phosphor layer 5 is almost the same as a height of the resin dam 9, and larger than a thickness of the LED chips 6, such as 0.6 to 1.0 mm.

As a preferable embodiment of the transparent resin, a silicone resin which has a viscosity of 3 Pa·s or more and 20 Pa·s or less before being hardened is used. In addition, in order to prevent each of the phosphors from settling out, and in order to efficiently make the lights diffuse from the LED chips 6 and each of the phosphors, fine silica particles are mixed in the silicone resin, as one example. In addition, an anti-settling agent or a diffusing agent such as silica particles not always has to be mixed.

As the green phosphor, a phosphor having a peak emission wavelength in a wavelength range of 510 nm or more and 550 nm or less is used such as an $Al_5Lu_xO_y$: Ce series phosphor, $Ca_3(Sc_{1-x}, Mg_x)_2Si_3O_{12}$: Ce series phosphor (here, it is preferable that $0.01 \leq x \leq 0.4$), or $Al_5O_{12}Y_3$: Ce series phosphor. Furthermore, as the green phosphor, a trivalent cerium activated silicate phosphor expressed by a following general formula can be used.

$$MI_3(MII_{1-x}Ce_x)_2(SiO_4)_3 \qquad \text{General formula:}$$

Here, MI is at least one element selected from Mg, Ca, Sr, and Ba, MII is at least one element selected from Al, Ga, In, Sc, Y, La, Gd, and Lu, and $0.01 \leq x \leq 0.4$ is satisfied.

A half-value width of an emission spectrum of the green phosphor is preferably wide because the green phosphor is composed of one kind, and for example, a phosphor having a half-value width of 95 nm or more is used. Each of the above LuAG series phosphor, CSMS series phosphor, and YAG series phosphor is a phosphor having a garnet crystal structure using Ce as an activating agent, so that a fluorescence spectrum having a wide half-value width (95 nm or more) can be obtained because Ce is used as the activating agent, and it is a green phosphor which is suitable for obtaining a high color rendering property. The half-value width of 102 nm is obtained in the $Al_5Lu_xO_y$: Ce series phosphor, and 103 nm is obtained in the $Ca_3(Sc, Mg)_2Si_3O_{12}$: Ce series phosphor, for example.

As the first red phosphor, a phosphor having a peak emission wavelength in a wavelength range of 610 nm or more and less than 625 nm is used such as $(Sr_{1-y}, Ca_y)_{1-x}AlSiN_3$: $Eu_x$ series phosphor (here, it is preferable that $0.001 \leq x \leq 0.05$, $0 \leq y < 0.2$).

As the second red phosphor, a phosphor having a peak emission wavelength in a wavelength range of 625 nm or more and 670 nm or less is used such as $(Sr_{1-y}, Ca_y)_{1-x}AlSiN_3$: $Eu_x$ series phosphor (here, it is preferable that $0.001 \leq x \leq 0.05$, $0.2 \leq y < 1$), or $Ca_{1-x}AlSiN_3$: $Eu_x$ series phosphor (here, it is preferable that $0.001 \leq x \leq 0.05$).

As for the $(Sr_{1-y}, Ca_y)_{1-x}AlSiN_3$: $Eu_x$ series phosphor, one part or a whole part of Ca is substituted with Sr, in $Ca_{1-x}AlSiN_3$: $Eu_x$ series phosphor, and each of them is a phosphor in which a fluorescent property is not likely to be fluctuated with respect to a temperature change. Therefore, when these are used as the first and second red phosphors, temperature dependency of the light emission in the red region can be small in the light emitting device, and when the $Ca_3(Sc, Mg)_2Si_3O_{12}$: Ce series phosphor or the $Al_5Lu_xO_y$: Ce series phosphor having a fluorescent property which is small in temperature dependency is used also for the green phosphor, the light emitting device can achieve small temperature dependency of a light emission property as a whole. That is, the light emitting device can be small in temperature dependency and high in color rendering property.

In addition, each of the $(Sr_{1-y}, Ca_y)_{1-x}AlSiN_3$: $Eu_x$ series phosphor, and the $Ca_{1-x}AlSiN_3$: $Eu_x$ series phosphor has a small specific gravity difference, so that, as will be described later, when it is added into the transparent resin to seal the light emitting element, a variation in settling out due to the specific gravity difference is small, and a variation in light emission properties including the color rendering property can be reduced in the light emitting device. Hereinafter, the $(Sr_{1-y}, Ca_y)_{1-x}AlSiN_3$: $Eu_x$ series phosphor, and the $Ca_{1-x}AlSiN_3$: $Eu_x$ series phosphor are appropriately simplified and referred to as the (Sr, Ca)AlSiN$_3$: Eu series phosphor, and the CaAlSiN$_3$: Eu series phosphor, respectively in a following description.

Furthermore, as the first and second red phosphors, a nitride phosphor expressed by a following general formula can be used.

$$(MI_{1-x}Eu_x)MIISiN_3 \qquad \text{General formula:}$$

Here, MI is at least one element selected from Mg, Ca, Sr, and Ba, MII is at least one element selected from Al, Ga, In, Sc, Y, La, Gd, and Lu, and $0.001 \leq x \leq 0.05$ is satisfied.

A half-value width of an emission spectrum of each of the first and second red phosphors is preferably as wide as the green phosphor, but since two kinds are used, an emission spectrum of the red phosphor as a whole is better to be limited so as not have a peak in a specific wavelength, and a phosphor having a half-value width of 85 to 110 nm is used, for example. As for the (Sr, Ca)AlSiN$_3$: Eu series phosphor, 88 nm is employed, and as for the CaAlSiN$_3$: Eu series phosphor, 90 nm is employed.

In addition, as for a grain diameter of each phosphor, a median value (D50) is preferably 8 μm or more and 20 μm or less in the green phosphor, and preferably 5 μm or more and 15 μm or less in the first and second red phosphors.

The phosphor layer 5 is an important component in the present light emitting device 1, so that the peak emission wavelength of the emission spectrum of each phosphor and a mixture ratio of the phosphors affect the light emission efficiency and the color rendering property, so that they will be described in detail in following seven examples.

The LED chip 6 is a bare chip as a semiconductor light emitting element which emits a light containing a blue component having a peak emission wavelength in a blue region (wavelength: 430 nm or more and 490 nm or less), and composed of an InGaN series LED. When the peak emission wavelength is less than 430, the color rendering property is reduced and when it is more than 490 nm, brightness in white color is reduced, so that the above wavelength range is preferable in view of practical use. According to the present embodiment, a light having a peak emission wavelength of about 450 nm is employed as one example. In addition, according to the present embodiment, the LED chips 6 are mounted on the substrate 2 by die bonding, and they are linearly arranged in a plurality of lines so as to be almost parallel to one side (X direction) of the substrate 2. Thus, the number of the chips in the line is greatest in the vicinity of a center of the circular ring shape formed along the wiring patterns 3 and the printed resistive element 8, and the number of chips in the line decreases with distance from the center toward a peripheral part so that they can be arranged at high density in the area surrounded by the wiring patterns 3. According to the example shown in FIG. 1, the LED chips 6 are arranged such that 12 lines each having 12 chips connected in series are connected in parallel. In addition, the LED chip 6 has a structure in which a light is emitted from a chip upper surface, and electrode pads (for an anode and a cathode) (not shown) are formed on the chip surface to be connected to the adjacent LED chip 6 or wiring pattern 3 with the wire 7. In addition, in a case where the LED chip 6 is a back surface emission type, wirings and lands corresponding to the wires 7 may be previously formed on the substrate 2, and the LED chip 6 may be mounted by flip-chip bonding through a bump with the electrode pad formed on its surface opposed to the surface of the substrate 2.

The printed resistive element 8 is provided with a view to increasing an electrostatic withstand voltage, and it is formed of $RhO_2$ so as to have a width of 200 μm, a width of 6 μm, and a resistance value of 50 MΩ, as one example. As shown in FIG. 1, the printed resistive element 8 is arranged so as to be connected to the one end of the wiring pattern 3a and the one end of the wiring pattern 3k, and has an arch shape partially cut from the circular ring. According to the present embodiment, each of the wiring pattern 3a, the printed resistive element 8, and the wiring pattern 3k serves as a part of the same circular ring.

The resin dam 9 is a resin to dam the phosphor layer 5 serving as the sealing resin, and made of a colored material (preferably white or milky white). According to the present embodiment, the resin dam 9 is formed of a white silicone resin (containing a filler of $TiO_2$) into a circular ring shape having a width of 1 mm, and a diameter of 9 mm. The resin dam 9 is formed such that the silicone resin is poured into the circular ring shape, and thermally hardened at a curing temperature of 150° C. for one hour. As shown in FIG. 1(*a*), the resin dam 9 is preferably formed so as to cover the arc shape part formed with the wiring patterns 3 and the printed resistive element 8.

Next, a description will be given of a relationship between a configuration of the phosphor layer 5 serving as the important component and optical properties (light emission intensity, general color rendering index Ra, special color rendering index R9, and color temperature) in the present light emitting device 1, based on the following seven examples 1 to 7. In the respective examples, at least one of the peak emission wavelength of the emission spectrum of each phosphor and the mixture ratio of the phosphors is different from one another. In addition, the mixture ratio is defined by a weight ratio. Furthermore, the mixture ratio of the green phosphor and a sum of the first and second red phosphors is 5:1 in common in each embodiment.

In addition, as for comparative examples 1 and 2 which will be described below to be compared with each of the examples, the above optical properties were measured. In addition, in each of the examples and the comparative examples, it was assumed to be used as a white light source having a color temperature in the vicinity of 3000 to 3300 K, so that the InGaN series LEDs having a peak emission wavelength in the vicinity of 450 nm were used as the LED chips 6. In addition, in each of the examples and the comparative examples, the configuration other than the phosphor layer 5 is the same as the above configuration, so that a duplicative description is omitted.

Example 1

In the example 1, as the green phosphor, an $Al_5Lu_xO_y$: Ce series phosphor having a peak emission wavelength in the vicinity of 535 nm was used, as the first red phosphor, a (Sr, Ca)$AlSiN_3$: Eu series phosphor having a peak emission wavelength in the vicinity of 620 nm was used, and as the second red phosphor, $CaAlSiN_3$: Eu series phosphor having a peak emission wavelength in the vicinity of 650 nm was used. In addition, the mixture ratio of the green phosphor, the first red phosphor, and the second red phosphor was set to 5:0.98:0.02. The relative value of the light emission intensity (based on lowest light emission intensity in the examples 1 to 7) was 118.6%, the general color rendering index Ra was 81.65, the special color rendering index R9 was 9.31, and the color temperature was 3263 K.

Example 2

In the example 2, as the green phosphor, a $Ca_3$(Sc, Mg)$_2Si_3O_{12}$: Ce series phosphor having a peak emission wavelength in the vicinity of 520 nm was used, as the first red phosphor, the (Sr, Ca)$AlSiN_3$: Eu series phosphor having the peak emission wavelength in the vicinity of 620 nm was used, and as the second red phosphor, the $CaAlSiN_3$: Eu series phosphor having the peak emission wavelength in the vicinity of 650 nm was used. In addition, the mixture ratio of the green phosphor, the first red phosphor, and the second red phosphor was set to 5:0.98:0.02. Differences from the example 1 were the peak emission wavelength and the phosphor material of the green phosphor.

The relative value of the light emission intensity was 109.3%, the general color rendering index Ra was 83.57, the special color rendering index R9 was 12.16, and the color temperature was 3004 K. Compared with the example 1, since the peak emission wavelength of the green phosphor was short, the emission intensity was reduced a little, but the color rendering property was enhanced.

Example 3

In the example 3, as the green phosphor, the $Al_5Lu_xO_y$: Ce series phosphor having the peak emission wavelength in the vicinity of 535 nm was used, as the first red phosphor, the (Sr, Ca)$AlSiN_3$: Eu series phosphor having the peak emission wavelength in the vicinity of 620 nm was used, and as the second red phosphor, a (Sr, Ca)$AlSiN_3$: Eu series phosphor having a peak emission wavelength in the vicinity of 630 nm was used. In addition, the mixture ratio of the green phosphor, the first red phosphor, and the second red phosphor was set to 5:0.83:0.17. Differences from the example 1 were the peak emission wavelength and the phosphor material of the second red phosphor, and the mixture ratio of the first and second red phosphors.

The relative value of the light emission intensity was 115.9%, the general color rendering index Ra was 82.26, the special color rendering index R9 was 9.44, and the color temperature was 3041 K. Compared with the example 1, the peak emission wavelength of the second red phosphor was short, but the mixture ratio thereof was increased, so that the light emission intensity was reduced a little, but it was kept at high level, and the color rendering property was improved.

Example 4

In the example 4, as the green phosphor, the $Al_5Lu_xO_y$: Ce series phosphor having the peak emission wavelength in the vicinity of 535 nm was used, as the first red phosphor, the (Sr, Ca)$AlSiN_3$: Eu series phosphor having the peak emission wavelength in the vicinity of 620 nm was used, and as the second red phosphor, the $CaAlSiN_3$: Eu series phosphor having the peak emission wavelength in the vicinity of 650 nm was used. In addition, the mixture ratio of the green phosphor, the first red phosphor, and the second red phosphor was set to 5:0.78:0.22. A difference from the example 1 was the mixture ratio of the first and second red phosphors.

The relative value of the light emission intensity was 115.0%, the general color rendering index Ra was 83.58, the special color rendering index R9 was 20.24, and the color temperature was 2987 K. Compared with the example 1, since the mixture ratio of the second red phosphor was increased, the light emission intensity was reduced a little, but it was kept at high level, and the color rendering property was further enhanced, so that this can be used for a lighting apparatus which targets Ra (standard value)=85 or Ra (minimum value)=80.

Example 5

In the example 5, as the green phosphor, the $Al_5Lu_xO_y$: Ce series phosphor having the peak emission wavelength in the vicinity of 535 nm was used, as the first red phosphor, the (Sr, Ca)$AlSiN_3$: Eu series phosphor having the peak emission wavelength in the vicinity of 620 nm was used, and as the second red phosphor, the $CaAlSiN_3$: Eu series phosphor having the peak emission wavelength in the vicinity of 650 nm was used. In addition, the mixture ratio of the green phosphor, the first red phosphor, and the second red phosphor was set to 5:0.5:0.5. A difference from the example 1 was the mixture ratio of the first and second red phosphors.

The relative value of the light emission intensity was 110.0%, the general color rendering index Ra was 86.41, the special color rendering index R9 was 36.02, and the color temperature was 3323 K. Compared with the example 1 and the example 4, since the mixture ratio of the second red phosphor was increased, the light emission intensity was reduced to 110%, but the color rendering property was further enhanced, so that this can be used for a lighting apparatus which targets Ra (minimum value)=85.

Example 6

In the example 6, as the green phosphor, the $Al_5Lu_xO_y$: Ce series phosphor having the peak emission wavelength in the vicinity of 535 nm was used, as the first red phosphor, the (Sr, Ca)$AlSiN_3$: Eu series phosphor having the peak emission wavelength in the vicinity of 620 nm was used, and as the second red phosphor, the $CaAlSiN_3$: Eu series phosphor having the peak emission wavelength in the vicinity of 650 nm was used. In addition, the mixture ratio of the green phosphor, the first red phosphor, and the second red phosphor was set to 5:0.25:0.75. A difference from the example 1 is the mixture ratio of the first and second red phosphors.

The relative value of the light emission intensity was 105.0%, the general color rendering index Ra was 91.1, the special color rendering index R9 was 55.9, and the color temperature was 3268 K. Compared with the example 1, the example 4, and the example 5, since the mixture ratio of the second red phosphor was increased, the light emission intensity was reduced to 105%, but the color rendering property was further enhanced, so that this can be used for a lighting apparatus which targets Ra (standard value)=90.

Example 7

In the example 7, as the green phosphor, the $Al_5Lu_xO_y$: Ce series phosphor having the peak emission wavelength in the vicinity of 535 nm was used, as the first red phosphor, the (Sr, Ca)$AlSiN_3$: Eu series phosphor having the peak emission wavelength in the vicinity of 620 nm was used, and as the second red phosphor, the $CaAlSiN_3$: Eu series phosphor having the peak emission wavelength in the vicinity of 650 nm was used. In addition, the mixture ratio of the green phosphor, the first red phosphor, and the second red phosphor was set to 5:0.02:0.98. A difference from the example 1 was the mixture ratio of the first and second red phosphors.

The relative value of the light emission intensity was 100.0%, the general color rendering index Ra was 93.7, the special color rendering index R9 was 82.75, and the color temperature was 3316 K. Compared with the example 1, and the examples 4 to 6, since the mixture ratio of the second red phosphor was further increased, the light emission intensity was reduced to 100%, but the color rendering property was further enhanced, so that this example can be used for a lighting apparatus which targets Ra (minimum value)=90.

Next, the comparative example 1 and the comparative example 2 will be described. According to each comparative example, the blue LED, the yellow phosphor, and the red phosphor disclosed in the patent document 1 are combined, and one kind of the yellow phosphor and one kind of the red phosphor are used.

Comparative Example 1

In the comparative example 1, as the yellow phosphor, a (Y, Gd)$_3$(Al, Ga)$_5O_{12}$: Ce series phosphor having a peak emission wavelength in the vicinity of 560 nm was used, and as the red phosphor, the (Sr, Ca)$AlSiN_3$: Eu series phosphor having the peak emission wavelength in the vicinity of 630 nm was used. In addition, a mixture ratio of the yellow phosphor and the red phosphor was set to 3.3:1. The relative value of the light emission intensity was 124.0%, the general color rendering index Ra was 73.0, the special color rendering index R9 was −5.0, and the color temperature was 2950 K.

Comparative Example 2

In the comparative example 2, as the yellow phosphor, the (Y, Gd)$_3$(Al, Ga)$_5O_{12}$: Ce series phosphor having the peak emission wavelength in the vicinity of 560 nm was used, and as the red phosphor, the $CaAlSiN_3$: Eu series phosphor having the peak emission wavelength in the vicinity of 650 nm was used. In addition, the mixture ratio of the yellow phosphor and the red phosphor was set to 3.9:1. The relative value of the light emission intensity was 114.0%, the general color rendering index Ra was 77.0, the special color rendering index R9 was 20.0, and the color temperature was 3000 K.

Figure 4:
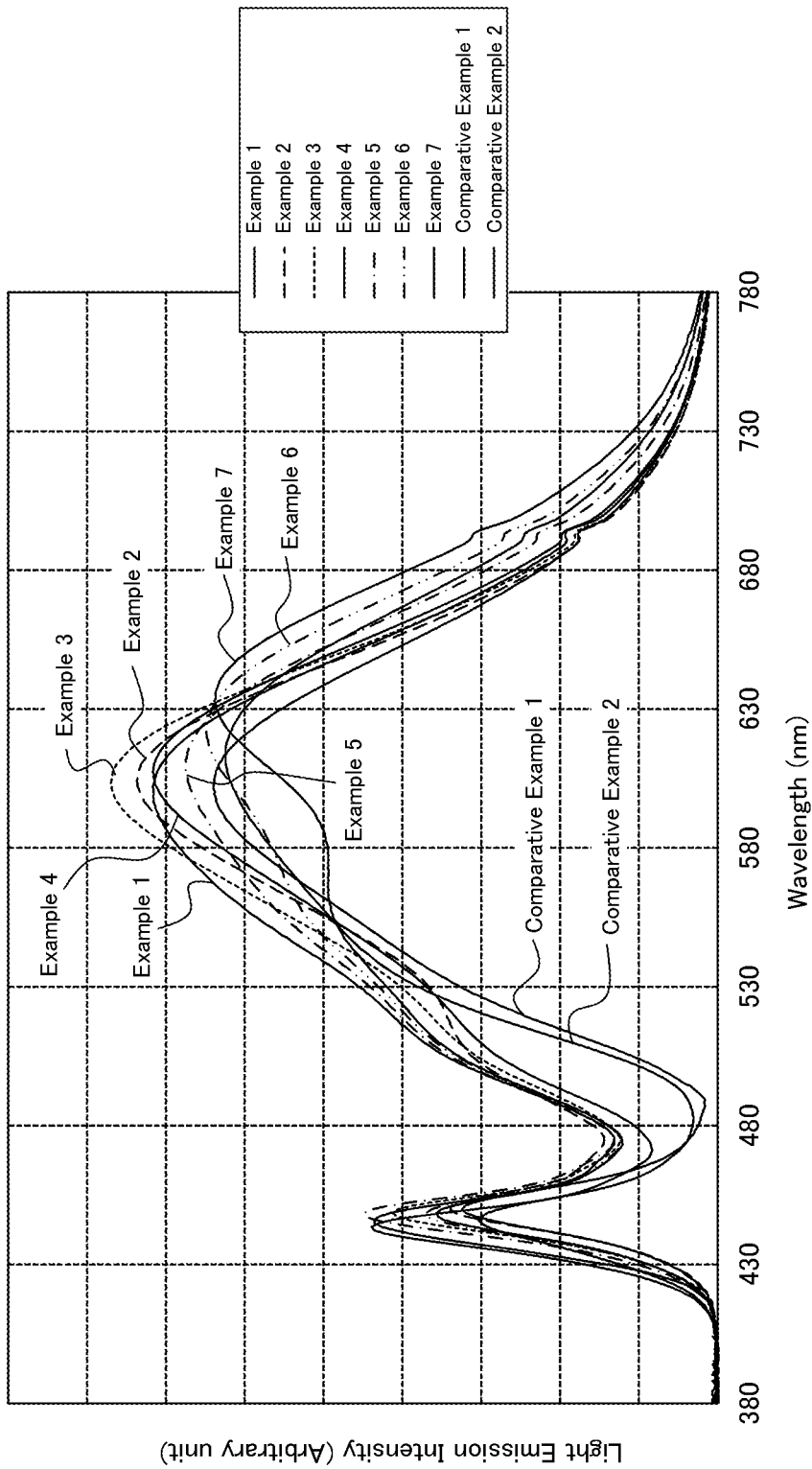
FIG. 4 is a view showing emission spectra of the examples 1 to 7, and the comparative examples 1 and 2.
Figure 5:
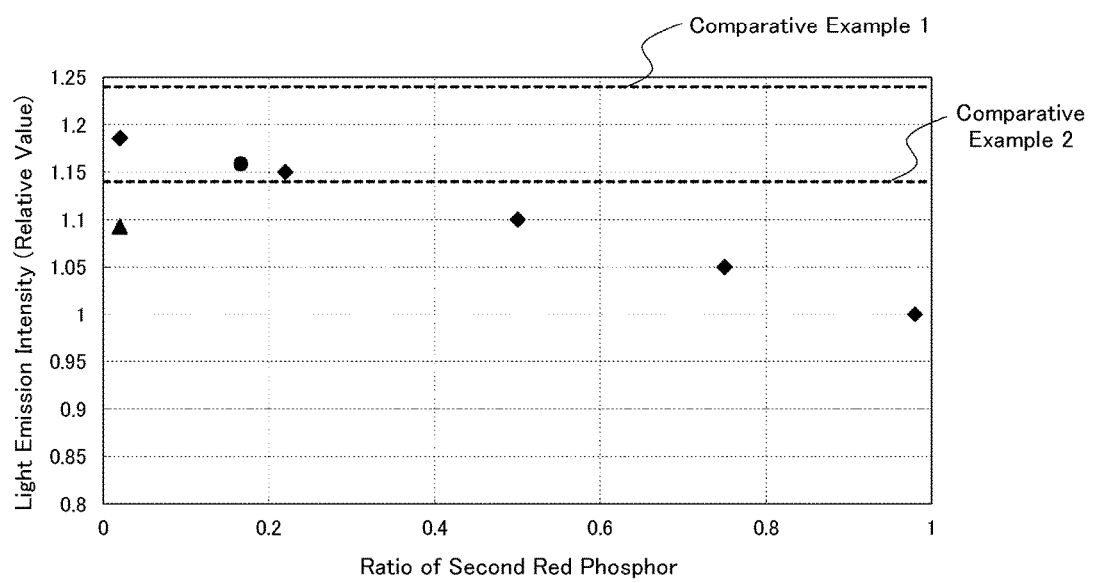
FIG. 5 is a view showing a relationship between light emission intensity (relative value) and a mixture ratio of the second red phosphor in each of the examples 1 to 7.
Figure 6:
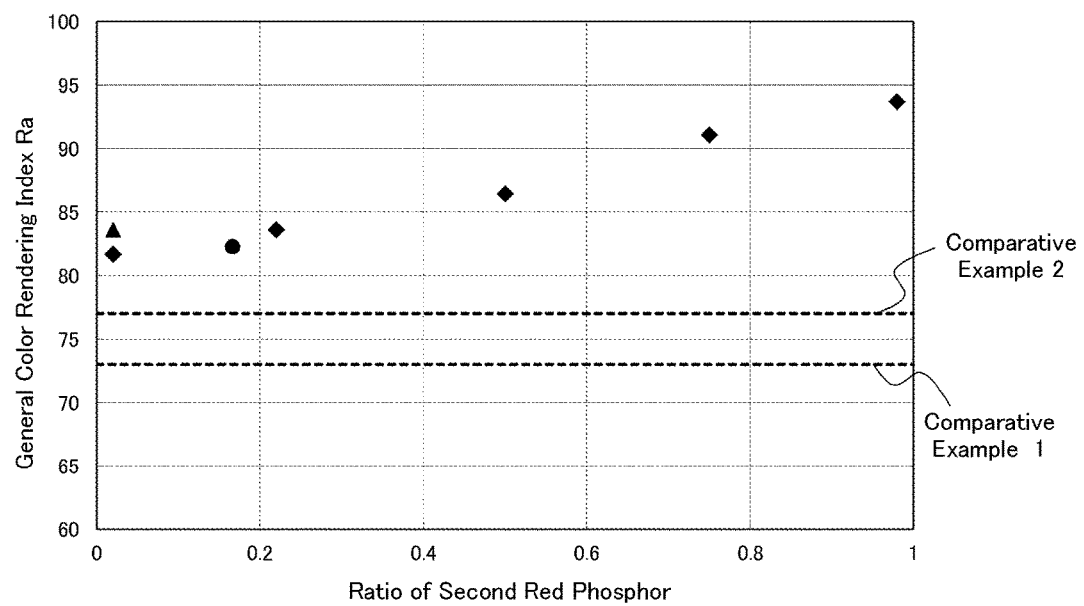
FIG. 6 is a view showing a relationship between a general color rendering index Ra and the mixture ratio of the second red phosphor in each of the examples 1 to 7.

Next, the measured results of the optical properties of the examples 1 to 7, and the comparative examples 1 and 2 are compared and reviewed with reference to FIGS. 2 to 6. FIG. 2 is a view of a list displaying the peak emission wavelengths, the mixture ratio, and the optical properties in each of the examples 1 to 7, and FIG. 3 is a view of a list displaying the peak emission wavelengths, the mixture ratio, and the optical properties in each of the comparative examples 1 and 2. FIG. 4 shows an emission spectrum in each of the examples and the comparative examples. FIG. 5 shows a relationship between the light emission intensity (relative value) and the mixture ratio of the second red phosphor in each of the examples. FIG. 6 shows a relationship between the general color rendering index Ra and the mixture ratio of the second red phosphor in each of the examples. In FIG. 5 and FIG. 6, the measured values of the examples 1, and 4 to 7 are shown by rhombus-shaped filled symbols, the measured value of the example 2 is shown by a triangular filled symbol, the measured value of the example 3 is shown by a circular filled symbol, and the measured values of the comparative examples 1 and 2 are shown as reference values by broken lines, respectively.

First, in the comparative examples 1 and 2, the general color rendering index Ra is lower than 80, and they do no reach a level to be used as the white light source for high color rendering lighting, while in the examples 1 to 7, the general color rendering index Ra exceeds 80, so that they reach the level to be used as the white light source for high color rendering lighting. In addition, when the examples 3 and 4 and the comparative example 2 each having the same degree of light emission intensity are compared, it is found that the higher color rendering property is shown in each of the examples 3 and 4.

Then, from FIG. 5 and FIG. 6, it is found that as the mixture ratio of the second red phosphor is increased (that is, as the mixture ratio of the first red phosphor is decreased), the light emission intensity is reduced, while the general color rendering index Ra is increased. In other words, by adjusting the mixture ratio of the first and second red phosphors, the desired general color rendering index Ra and light emission intensity can be obtained in the region in which the general color rendering index Ra is 80 or more. For example, when the color rendering property of 80≤Ra≤85 is targeted, the mixture ratio of the second red phosphor is to be adjusted to 25% or less, when the color rendering property of 85≤Ra≤90 is targeted, the mixture ratio of the second red phosphor is to be adjusted to 25% or more and 75% or less, and when the color rendering property of 90≤Ra≤97 is targeted, the mixture ratio of the second red phosphor is to be adjusted to 75% or more.

When the example 1 and the example 2 each having the same mixture ratio of the second red phosphor are compared with each other, the light emission intensity is higher but the color rendering property is lower in the example 1. Meanwhile, when the example 2 and example 5 each having almost the same light emission intensity are compared with each other, the color rendering property is higher in the example 5. That is, it is found that by adjusting each of the peak emission wavelength of the green phosphor and the mixture ratio of the first and second red phosphors, the color rendering property can be improved while the light emission intensity is maintained.

The light emission intensity of each of the examples 1, and 3 to 5 is at the same level as the light emission intensity of the comparative example 1, and higher than the light emission intensity of the comparative example 2. Meanwhile, as described above, the color rendering property is improved, compared with the comparative examples 1 and 2. In the examples 2, 6, and 7, as described above, the improvement in color rendering property is more focused on than the examples 1, and 3 to 5, so that the light emission intensity is lower than the light emission intensity of the comparative example 1, but it is at the same level as the light emission intensity of the comparative example 2. In addition, the light emission intensity being at the same level means that the light emission intensity falls within a range of ±15%, based on reference light emission intensity.

From FIG. 5 and FIG. 6, it is found that the measured value of the example 3 having the different peak emission wavelength of the second red phosphor roughly overlaps with a line provided by connecting the measured values of the examples 1, and 4 to 7 in which only the mixture ratios of the first and second red phosphors are different. In the examples 1, and 4 to 7, the peak emission wavelengths of the first and second red phosphors are 620 nm and 650 nm, respectively and a difference between them is 30 nm, while in the example 3, the peak emission wavelengths of the first and second red phosphors are 620 nm and 630 nm, respectively and a difference between them is 10 nm. Thus, it is found that even when the difference between the peak emission wavelengths of the first and second red phosphors is 10 nm, the light emission intensity and the color rendering property can be controlled by adjusting the mixture ratio of the first and second red phosphors or adjusting each of the peak emission wavelength of the green phosphor and the mixture ratio of the first and second red phosphors. In addition, it is found that the peak emission wavelengths of the first and second red phosphors are to be set such that based on an intermediate value between 620 nm and 630 nm (625 nm, for example), the peak emission wavelength of the first red phosphor is set to be shorter than the intermediate value, and the peak emission wavelength of the second red phosphor is set to be longer than the intermediate value. According to spectral radiance factor of red color of a test color number 9 (0.4 to 0.8), it is considered preferable to roughly set the peak emission wavelength of the first red phosphor in a range of 610 to 625 nm, and the peak emission wavelength of the second red phosphor in a range of 625 nm or more and 670 nm or less because the special color rendering index R9 can be highly improved.

As described above, according to the present light emitting device 1, since the 144 LED chips 6 are arranged in the circular region, a semiconductor light emitting device in 30 W class can be realized, and it can be substituted for an incandescent bulb of 100 W, halogen lamp, or HID lamp especially in general lighting usage, so that it can be applied to wide usage. In addition, since the resin dam 9 has the shape of the circular ring, an optical design (design for a lens or reflector) needed when used for lighting can be relatively easily provided. Furthermore, since the LED chips 6 are arranged in the circle and uniformly dispersed, as for the light emitted from the present light emitting device 1, variations in color rendering property, chromaticity, color temperature, and the like can be prevented from being generated. In addition, when once a transparent resin in which phosphors having different peak emission wavelengths and mixture ratios are mixed is previously prepared, the present light emitting device 1 having various optical properties can be obtained only by a step of injecting the transparent resin in the resin dam 9 and thermally hardening it in an in-process material of the present light emitting device 1 in which the resin dam 9 has been just formed.

OTHER EMBODIMENTS

Hereinafter, embodiments other than the above embodiment will be described.

<1> In the above embodiment, the green phosphor, the first red phosphor, and the second red phosphor are mixed in the phosphor layer 5 (one-layer structure), but the phosphor layer 5 may be configured to be divided into two layers or three layers.

For example, as schematically shown in FIG. 7, the phosphor layer 5 may be configured by sequentially laminating a first red phosphor layer 5*a* in which grains of the first red phosphor is mixed in a transparent resin, a second red phosphor layer 5*b* in which grains of the second red phosphor is mixed in a transparent resin, and a green phosphor layer 5*c* in which grains of the green phosphor is mixed in a transparent resin, from the side of the LED chips 6. In this case, a mixture ratio of the phosphors as a whole of the phosphor layers 5a to 5c may be determined similar to the case of the phosphor layer 5 composed of the one layer.

Figure 7A:
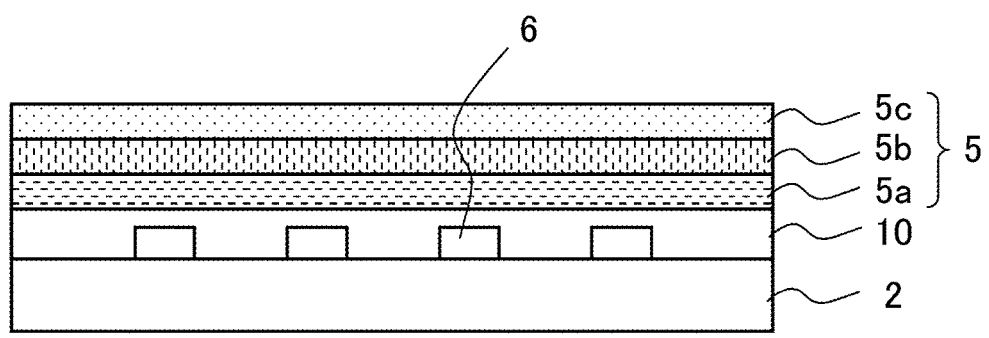
FIG. 7A and FIG. 7B are schematic essential part cross-sectional views schematically showing schematic structures of other embodiments in which a phosphor layer of the light emitting device according to the present invention has a multilayer structure.
Figure 7B:
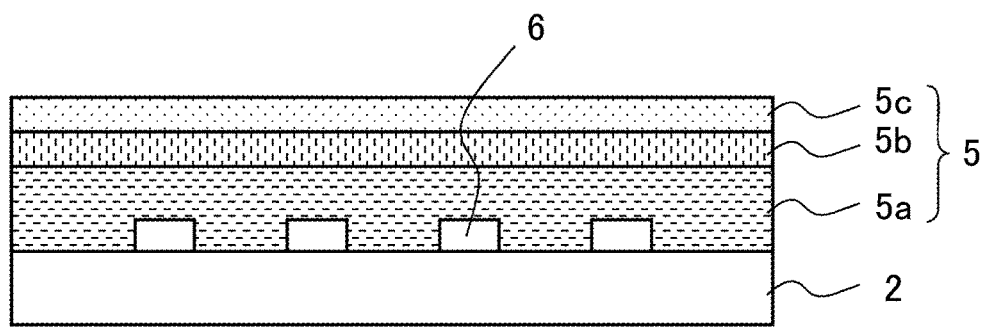

Here, as shown in FIG. 7(a), it is preferable to form the three-layer phosphor layer 5 on a layer in which the LED chips 6 are sealed with a transparent resin layer 10 which does not contain the phosphor. In this case, a thickness of the transparent resin layer 10 is to be the same as the thickness of the LED chips 6 (about 80 to 200 μm) or more. In addition, as shown in FIG. 7(b), the LED chips 6 may be sealed with the first red phosphor layer 5a, and the other two layers of the second red phosphor layer 5b and the green phosphor layer 5c may be laminated thereon without the formation of the transparent resin layer 10. In addition, the order of the first red phosphor layer 5a and the second red phosphor layer 5b may be exchanged.

Furthermore, as schematically shown in FIG. 8, the phosphor layer 5 may be configured by sequentially laminating a red phosphor layer 5d in which grains of the first red phosphor and second red phosphor are mixed in a transparent resin, and the green phosphor layer 5c in which grains of the green phosphor is mixed in the transparent resin, from the side of the LED chips 6. In this case, the mixture ratio of the phosphors as a whole of the phosphor layers 5c and 5d may be determined similar to the case the phosphor layer 5 composed of the one layer.

Figure 8A:
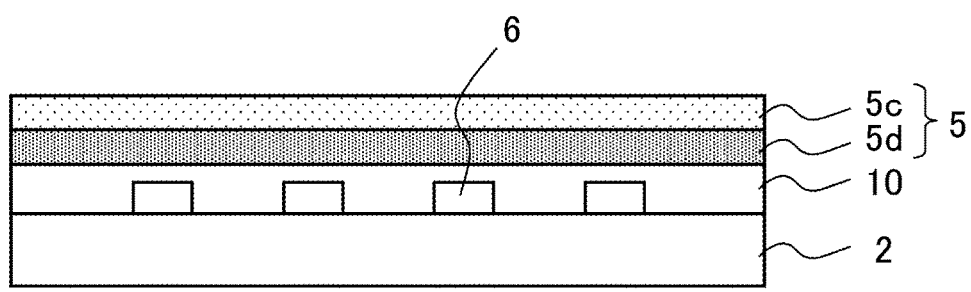
FIG. 8A and FIG. 8B are schematic essential part cross-sectional views schematically showing schematic structures of other embodiments in which the phosphor layer of the light emitting device according to the present invention has a multilayer structure.
Figure 8B:
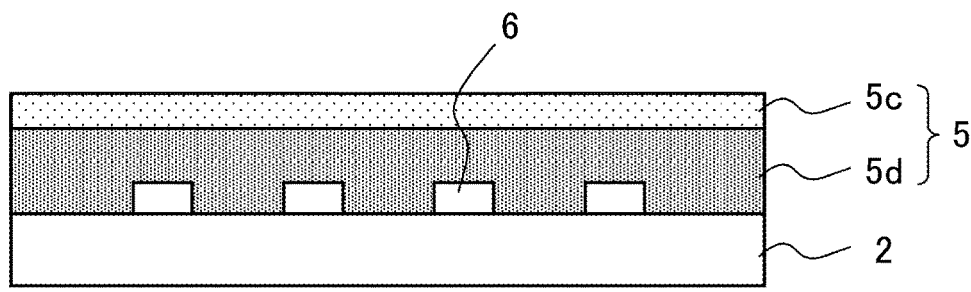

Here, as shown in FIG. 8(a), it is preferable to form the two-layer phosphor layer 5 on the layer in which the LED chips 6 are sealed with the transparent resin layer 10 which does not contain the phosphor. In addition, as shown in FIG. 8(b), the LED chips 6 may be sealed with the red phosphor layer 5d, and the green phosphor layer 5c may be laminated thereon without the formation of the transparent resin layer 10.

In addition, each of the (Sr, Ca)AlSiN$_3$: Eu series phosphor, and the CaAlSiN$_3$: Eu series phosphor used for the first and second red phosphors illustrated in the above embodiment is wide in absorption band and absorbs the light having a green component, so that when the green phosphor layer 5c is formed as the uppermost layer of the phosphor layer 5 in the configurations in FIG. 7 and FIG. 8, the light having the green component emitted from the green phosphor can be prevented from being absorbed by the first or the second red phosphor, and as a result, the light emission efficiency can be prevented from being reduced, which is preferable.

Furthermore, in the case where the phosphor layer 5 has the multilayer structure, the layers may be sequentially formed such that the injection and thermal hardening are performed for each of the layers, or may be formed such that the injection is performed for one part or a whole part of the layers first, and the thermal hardening is performed at once later. That is, a boundary of the layers not always has to be clearly isolated. In addition, the configurations shown in FIG. 7 and FIG. 8 may be mixed. For example, the first red phosphor layer 5a, the second red phosphor layer 5b, and the red phosphor layer 5d having one or more different mixture ratios may be appropriately combined so as to finally obtain the necessary mixture ratio of the first red phosphor and the second red phosphor. Therefore, the number of the layers of the phosphor layer 5 is not limited to 1 to 4.

<2> In the above embodiment, the description has been given of the case where the LED chip 6 is composed of the InGaN series LED as the semiconductor light emitting element which emits the light containing the blue component having the peak emission wavelength (light emission peak) in the blue region (wavelength: 430 nm or more and 490 nm or less), but the present invention can be applied to a case where the peak emission wavelength of the light emitted from the LED chip 6 exists from a near-ultraviolet region to a violet region (wavelength: 350 nm or more and less than 430 nm). The LED chip 6 is preferably composed of the InGaN series LED similar to the above embodiment. However, it is to be noted that when the emission spectrum of the LED chip 6 is shifted toward a short wavelength, the light having the blue component emitted from the LED chip 6 becomes insufficient or lacking, so that it is preferable to add a blue phosphor which is excited by a near-ultraviolet light or violet light and emits light having a blue component (having a peak emission wavelength within a range of 430 nm or more and 490 nm or less, for example), as a phosphor to be mixed in the transparent resin in the phosphor layer 5, other than the green phosphor, the first red phosphor, and the second red phosphor. The blue phosphor includes a divalent europium activated halophosphate phosphor, a divalent europium activated aluminate phosphor, and a divalent europium and manganese co-activated aluminate phosphor expressed by following three general formulas.

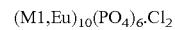

General formula:

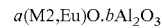

General formula:

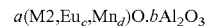

General formula:

Here, M1 is at least one kind of element selected from Mg, Ca, Sr, and Ba, M2 is at least one kind of element selected from Mg, Ca, Sr, Ba, and Zn, and a, b, c, and d are the numbers satisfying that a>0, b>0, 0.1≤a/b≤1.0, and 0.001≤d/c≤0.

Even when the blue phosphor is used, an only difference is in that the blue light emission is not emitted from the LED chips 6, but from the blue phosphor, so that the effect of the present invention obtained by using the two kinds of red phosphors of the first red phosphor and the second red phosphor can be provided similar to the above embodiment as a matter of course. In addition, the phosphor layer 5 including the blue phosphor may have the multilayer structure as shown in the other embodiment <1>. In this case, it is preferable that the blue phosphor layer is provided over the layers containing the green phosphor, the first red phosphor, and the second red phosphor, that is, as an uppermost layer.

<3> In the above embodiment, as shown in FIG. 1, the mounting configuration in which the plurality of the LED chips 6 are mounted on the ceramic substrate 2 has been illustrated, but the shape, material, and size of the ceramic substrate 2, the mounted number and the shape of the mounted area of the LED chips 6, the shape and thickness of the phosphor layer 5, the material, and the number of layers of the transparent resin, and the like are not limited to the above embodiment. In addition, instead of the resin dam 9, a resin frame having a concave part as shown in FIG. 1 in the patent document 1 may be formed on the ceramic substrate 2, the LED chips 6 may be mounted on the concave part, and the transparent resin containing the phosphors may be injected into the concave part to seal the LED chips 6.

Figure 9A:
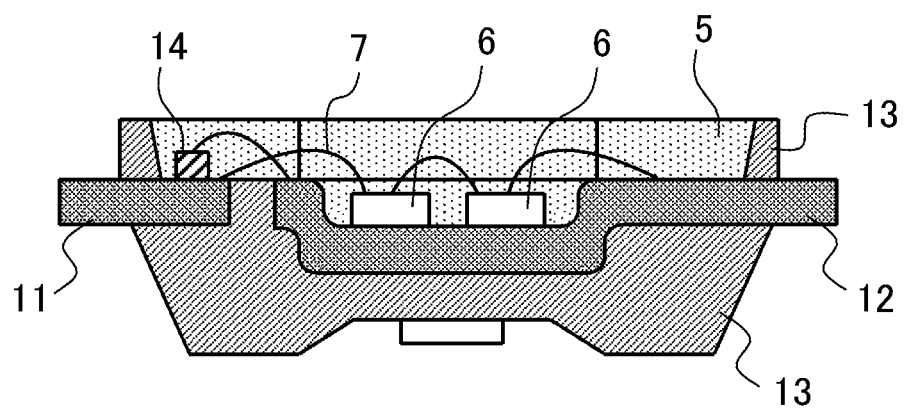
FIG. 9A and FIG. 9B are schematic cross-sectional views schematically showing schematic structures of other embodiments in which the light emitting device according to the present invention with a lead frame package.
Figure 9B:
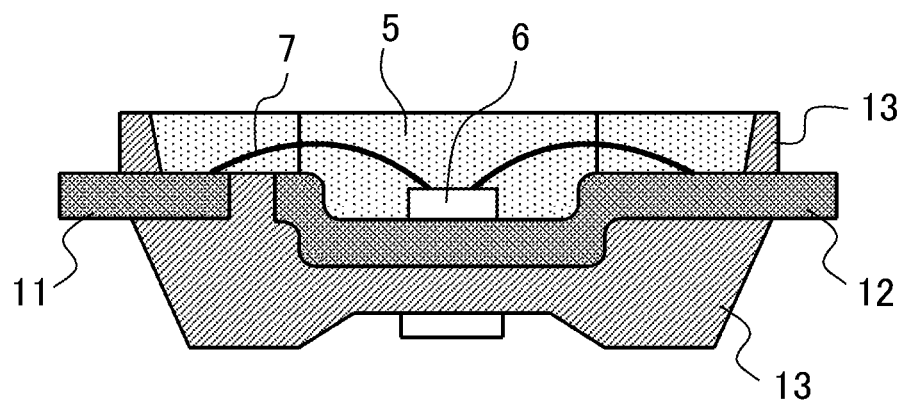

<4> In addition, as another mounting embodiment, the LED chips 6 may be mounted not on the ceramic substrate 2 but on a package using a lead frame. FIGS. 9(a) and 9(b) schematically show cross-sectional structures when the chip is mounted on a lead frame package. According to a mounting example in each of FIGS. 9(a) and 9(b), two lead terminals 11 and 12 in which one serves as an anode terminal and the other serves as a cathode terminal are provided, a concave part for housing the LED chip 6 is provided in the one lead terminal, the LED chip 6 is mounted on the concave part of the one lead terminal by die bonding, and a transparent resin containing a green phosphor, a first red phosphor, and a second red phosphor is poured over the LED chip 6, and the lead terminals 11 and 12 to form the phosphor layer 5. In addition, a package body part 13 made of an opaque resin to fix the lead terminals 11 and 12 is formed under the lead terminals 11 and 12, and around the region filled with the transparent resin.

FIG. 9(*a*) shows the mounting example for mounting two chips, in which one electrode pad (not shown) of the one LED chip 6 and the one lead terminal are connected to each other through a wire 7, the other electrode pad (not shown) of the one LED chip 6 and one electrode pad (not shown) of the other LED chip 6 are connected to each other thorough the wire 7, and the other electrode pad (not shown) of the other LED chip 6 and the other lead terminal are connected to each other through the wire 7, whereby a series circuit of the two LED chips 6 is formed. In addition, according to the mounting example in FIG. 9(*a*), a zener diode 14 serving as a protective element is intervened between the two lead terminals 11 and 12. Furthermore, FIG. 9(*b*) shows the mounting example in which one chip is mounted, in which one electrode pad (not shown) of the LED chip 6 and one lead terminal are connected to each other through the wire 7, and the other electrode pad (not shown) of the LED chip 6 and the other lead terminal are connected to each other through the wire 7.

In addition, in the example in FIG. 9(*a*), the mounted number of the LED chips 6 may be three or more. In addition, in the mounting examples in FIGS. 9(*a*) and 9(*b*), the phosphor layer 5 may have the multilayer structure as shown in the above embodiment <1>.

Figure 10:
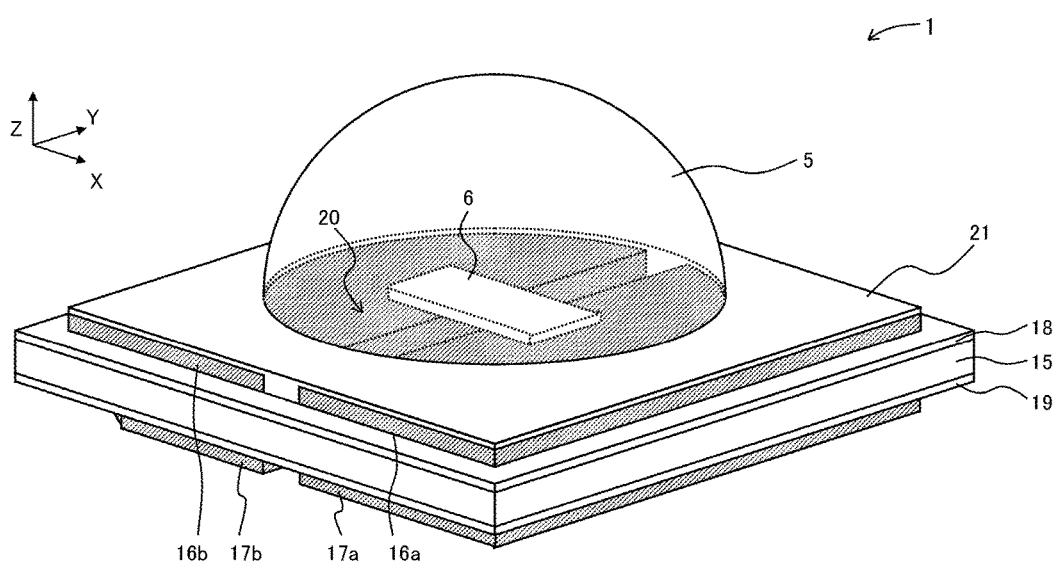
FIG. 10 is a schematic cross-sectional view schematically showing a schematic structure of another embodiment in which the phosphor layer of the light emitting device according to the present invention has a dome shape.

<5> In addition, a structure may be provided such that the LED chip 6 is mounted on the ceramic substrate 2, and instead of forming the phosphor layer 5 into the flat plate shape, the phosphor layer 5 may be formed into a dome shape as will be illustrated in FIG. 10.

More specifically, a pair of land parts 16*a* and 16*b* made of a metal film piece is provided on an upper surface of an insulating film 15 instead of being provided on the ceramic substrate 2, a pair of externally connecting terminal parts 17*a* and 17*b* made of a metal film piece is provided on a lower surface of the insulating file 15, and a film-shaped substrate is provided such that the land parts 16*a* and 16*b* are bonded to the upper surface of the insulating film 15 through a bonding layer 18, and the terminal parts 17*a* and 17*b* are bonded to the lower surface of the insulating film 15 through a bonding layer 19. The land part 16*a* and the terminal part 17*a* are opposed to each other across the insulating film 15, and they are electrically connected through two penetrating conductors (not shown) penetrating the insulating film 15. Similarly, the land part 16*b* and the terminal part 17*b* are opposed to each other across the insulating film 15, and they are electrically connected through two penetrating conductors (not shown) penetrating the insulating film 15. The number of the respective penetrating conductors may be one, three, or more. The pair of land parts 16*a* and 16*b* is electrically insulated from each other by an elongated gap extending between the land parts in a Y direction. Similarly, the pair of terminal parts 17*a* and 17*b* is also electrically insulated from each other by an elongated gap extending between the terminal parts in the Y direction. According to the present embodiment <5>, as one example of the insulating film 15, a polyimide film having a film thickness of 0.05 mm is used. An annular liquid shedding layer 21 having an opening part 20 which exposes a circular region including a center part of the gap, in its center is provided on the pair of land parts 16*a* and 16*b* and the gap therebetween, and the LED chip 6 is mounted on the pair of lands parts 16*a* and 16*b* in the opening part 20. According to a mounting example shown in FIG. 10, the LED 6 is a back surface emission and flip-chip type LED having a pair of electrode pads (for an anode and cathode) (not shown) formed on a chip surface, and the respective electrode pads are connected to the land parts 16*a* and 16*b* through bumps, with its back surface facing upward. When the LED chip 6 is a front surface emission type, the respective electrode pads are connected to the land parts 16*a* add 16*b* through the wires. The transparent resin in which the three kinds of phosphors such as the green phosphor, and the first and second red phosphors are mixed similar to the above embodiment is injected to the opening part 20 with a mask member to cover the liquid shedding layer 21, by a squeegee printing method, for example, and the mask member is removed, so that the dome shape is naturally formed due to a liquid-shedding property of the liquid shedding layer 21 and surface tension of the transparent resin, and a thermally hardening process is performed after that, whereby the domed phosphor layer 5 to seal the LED chip 6 is formed.

When the plurality of pairs of the land parts 16*a* and 16*b* and the plurality of pairs of the terminal parts 17*a* and 17*b* are formed on the front and back surfaces of the insulating film 15, respectively, the plurality of the present light emitting devices 1 each having the structure shown in FIG. 10 can be formed at the same time, and when the insulating film 15 is cut around the pair of land parts 16*a* and 16*b* based on the required number, the given number of the present domed light emitting devices can be obtained. The number of the LED chips 6 mounted in the opening part 20 may be 2 or more.

<6> The variations of the mounting configuration of the present light emitting device have been described in the other embodiments <4> and <5>, but the mounting configuration of the present light emitting device 1 is not limited to the embodiment and other embodiments illustrated above.

<7> In addition, the description has been given assuming that the present light emitting device is used as the white light source for lighting in the above embodiment, but when the present light emitting device employs a mounting configuration suitable for a backlight of a liquid crystal display device, it can be applied to the backlight.

<8> Furthermore, in the above examples 1 to 7, the combination and the mixture ratio of the phosphors have been defined for the white light source having the color temperature in the vicinity of 3000 to 3300 K, but for example, a configuration may be made such that the mixture ratio of the phosphors is appropriately changed under the same combination of the phosphors for a white light source having a higher color temperature such as daylight color having color temperature in the vicinity of 5000 K. For example, when the mixture ratio of the green phosphor and the sum of the first and second red phosphors is set to 7.7:1, and the mixture ratio of the first red phosphor and the second red phosphor is set to 0.85:0.15, the light emitting device can achieve the high color rendering property and high light emission efficiency.

EXPLANATION OF REFERENCES

1: light emitting device
2: ceramic substrate
3, 3*a*, 3*k*: wiring pattern
4, 4*a*, 4*k*: electrode land 5: phosphor layer
5a: first red phosphor layer
5b: second red phosphor layer
5c: green phosphor layer
5d: red phosphor layer
6: LED chip
7: wire
8: printed resistive element
9: resin dam
10: transparent resin layer
11, 12: lead terminal
13: package body part
14: zener diode
15: insulating film
16a, 16b: land part
17a, 17b: terminal part
18, 19: bonding layer
20: opening part
21: liquid shedding layer

The invention claimed is:

1. A lighting device comprising:
a ceramic substrate;
a light emitting chip mounted on said ceramic substrate, for generating a primary light having a peak wavelength of 430 to 490 nm, said light emitting chip having a bottom surface facing said ceramic substrate and an upper surface;
a pair of wires for electrically connecting said light emitting chip to a power supply, each of the wires having an end contacting with the upper surface of said light emitting chip; and
a phosphor layer comprising:
a first layer including a first phosphor composed of cerium, aluminum, lutetium and oxygen, for converting a portion of the primary light to a light having a first peak wavelength of 510 to 550 nm, and
a second layer including a second phosphor composed of europium, silicon, aluminum and nitrogen, for converting a portion of the primary light to a light having a second peak wavelength longer than the first peak wavelength.

2. The lighting device of claim 1, wherein the second phosphor has a half-value width of 85 to 110 nm.

3. The lighting device of claim 1, wherein said phosphor layer further includes silica.

4. The lighting device of claim 1, wherein
a mixed light of the primary light, a first converted light by the first phosphor and a second converted light by the second phosphor is emitted from an upper surface of the first layer, and
a bottom surface of the first layer receives the second converted light that is emitted from an upper surface of the second layer.

5. The lighting device of claim 4, wherein the bottom surface of the first layer and the upper surface of the second layer contact with each other.

6. The lighting device of claim 4, wherein said light emitting chip is located with a distance between said light emitting chip and the second layer.

7. The lighting device of claim 1, wherein a median value of a grain diameter of the first phosphor is at least 8 μm and at most 20 μm.

8. The lighting device of claim 1, wherein a median value of a grain diameter of the second phosphor is at least 5 μm and at most 15 μm.

9. The lighting device of claim 1, wherein said light emitting chip is an LED.

10. The lighting device of claim 1, wherein the first phosphor is an $Al_5Lu_xO_y$: Ce series phosphor.

11. A lighting device comprising:
a ceramic substrate;
a light emitting chip mounted on said ceramic substrate, for generating a primary light having a peak wavelength of 430 to 490 nm, said light emitting chip having a bottom surface facing said ceramic substrate and an upper surface;
a pair of wires for electrically connecting said light emitting chip to a power supply, each of the wires having an end contacting with the upper surface of said light emitting chip; and
a phosphor layer including:
a first phosphor composed of cerium, aluminum, lutetium and oxygen, for converting a portion of the primary light to a light having a first peak wavelength of 510 to 550 nm, and
a second phosphor composed of europium, silicon, aluminum and nitrogen, for converting a portion of the primary light to a light having a second peak wavelength longer than the first peak wavelength,
wherein, the phosphor layer is configured to be divided into plural layers,
a first layer of the plural layers includes the first phosphor and does not include the second phosphor, and
a second layer of the plural layers includes the second phosphor and does not include the first phosphor.

* * * * *